SOLID STATE TRAVELING WAVE DEVICES

Filed Sept. 21, 1967

INVENTOR.
Robert Adler
BY
David P. Ogden
Attorney

United States Patent Office 3,388,334

Patented June 11, 1968

3,388,334

SOLID STATE TRAVELING WAVE DEVICES

Robert Adler, Northfield, Ill., assignor to Zenith Radio Corporation, Chicago, Ill., a corporation of Delaware Continuation-in-part of application Ser. No. 499,936, Oct. 21, 1965. This application Sept. 21, 1967, Ser. No. 669,533
12 Claims. (Cl. 330—5.5)

ABSTRACT OF THE DISCLOSURE

A solid-state acoustic signal translating device having input and output transducers coupled to a relatively long piezoelectric element. Semiconductor film means secured to the long element has induced therein bunching of charge carriers, such as electrons or holes, corresponding to the effective wavelength of the acoustic waves in the element. D.C. voltage applied to the film means causes the carriers to drift. One portion of the carriers causes acoustic waves traveling in one direction in the piezoelectric element to be amplified. Another portion of the carriers causes acoustic waves traveling in the opposite direction to be attenuated. The combination provides an unconditionally stable amplifier.

*Related application*

The present application is a continuation-in-part of application Ser. No. 499,936 filed on Oct. 21, 1965, now abandoned, in the name of Robert Adler and assigned to the assignee of the present invention.

*Background of the invention*

This invention pertains to solid-state acoustic amplifiers. More specifically, it relates to an acoustic amplifier in which juxtaposed semiconductive and piezoelectric elements cooperate to amplify acoustic waves. While the amplifier is capable of amplifying acoustic waves, i.e., mechanical wave vibrations or coherent elastic waves, at most any frequency, it is particularly advantageous at frequencies above the audio range and will, therefore, be described in that environment.

It is known that certain semiconductor materials, such as single crystals of cadmium sulfide, also exhibit piezoelectric properties. When a piezoelectric crystal provided with a pair of opposing surface electrodes is subjected to a mechanical strain, an electric field is generated in the material and a resulting potential difference is developed between the surface electrodes. Conversely, a mechanical strain is developed in the material in response to the application of a voltage between the surface electrodes. An applied alternating signal results in alternating expansions and contractions in the material and, conversely, an applied periodic mechanical wave vibration develops a corresponding alternating electric signal. The electric field may be oriented either longitudinally or transversely with respect to the axis of mechanical wave vibration, so that such crystals may be employed as either longitudinal-mode or transverse-mode electromechanical transducers.

When a single crystal that is both piezoelectric and semiconductive is formed as a bar of a length corresponding to several wavelengths at a predetermined signal frequency, and when one end of the bar is subjected to mechanical vibration at the signal frequency, the mechanical vibrations are propagated along the bar as acoustic waves produced by alternating localized expansions and contractions in the material. It is known that when, at the same time, a steady state electrical biasing field of an appropriate magnitude and polarity is impressed along the length of the material as by connecting a certain magnitude D.C. voltage source between the ends of the bar, acoustic wave amplification may be obtained.

It has been proposed that a solid-state acoustic amplifier comprise such a piezoelectric semiconductive bar in association with an input transducer at one end for imparting compressional-wave vibrations to the bar and an output transducer at the other end for converting the amplified compressional wave vibrations to an electrical output signal. In use, the device may serve as a miniaturized intermediate frequency amplifying stage in an amplitude modulation or frequency modulation radio receiver or the like. However, the number of crystalline materials simultaneously having the piezoelectric and semiconductive properties is limited, and even in those particular crystals optimum amplifier characteristics have not been available.

Present studies indicate that substantial amplification is obtainable by such piezoelectric and semiconductive materials. Not only will a signal applied to the system be amplified, but also various noises, such as harmonics of desired signals, occur within the material and will be similarly amplified. Since normal output signal transducers would be expected to be receptive of only selected frequencies corresponding to those frequencies applied to the system, noise of different frequencies would tend to be amplified regeneratively. Such amplification would provide an oscillatory and unstable system.

*Summary of the invention*

Although it is desirable for stability purposes that an amplifier be unidirectional, this property is not readily available in conventional acoustic amplifiers. By unidirectional as used here it is meant amplification of only a forward moving acoustic wave without effective net amplification of any reflected waves. Accordingly, it is a primary object of the present invention to provide a new and useful unidirectional solid-state acoustic amplifier.

It is another object of the present invention to provide a new and improved solid-state acoustic amplifier of characteristically low power dissipation.

A solid-state acoustic signal translator constructed in accordance with the invention comprises an acoustic wave propagating device including an element composed of a piezoelectric material and a juxtaposed semiconductor film means of lengths in the direction of acoustic wave propagation that are large relative to the wavelengths of the acoustic signal in the material and film means. Coupled to the wave propagating device are means responsive to an input signal for creating acoustic waves in the piezoelectric element which induce correspondingly bunched electric charges which in turn induce corresponding charge bunches in the semiconductor film means. In addition, means coupled to the wave propagating device respond to the acoustic waves and develop an output signal corresponding to the input signal. Finally, means are provided for effectively impressing a steady state bias voltage across the film means parallel to the direction of wave propagation to establish a flow of electric charge carriers in the film means having mobility parallel to the direction of wave propagation to amplify the amplitude of the forward directed acoustic waves, and to attenuate any reflected waves.

*Brief description of the drawing*

The features of the present invention which are believed to be novel are set forth with particularity in the appended claims. The invention, together with further objects and advantages thereof, may best be understood by reference to the following description taken in connection with the accompanying drawing, in the several figures of which like reference numerals identify like elements, and in which:

*Description of preferred embodiments*

Figures 1, 2, 3, 4, 5:
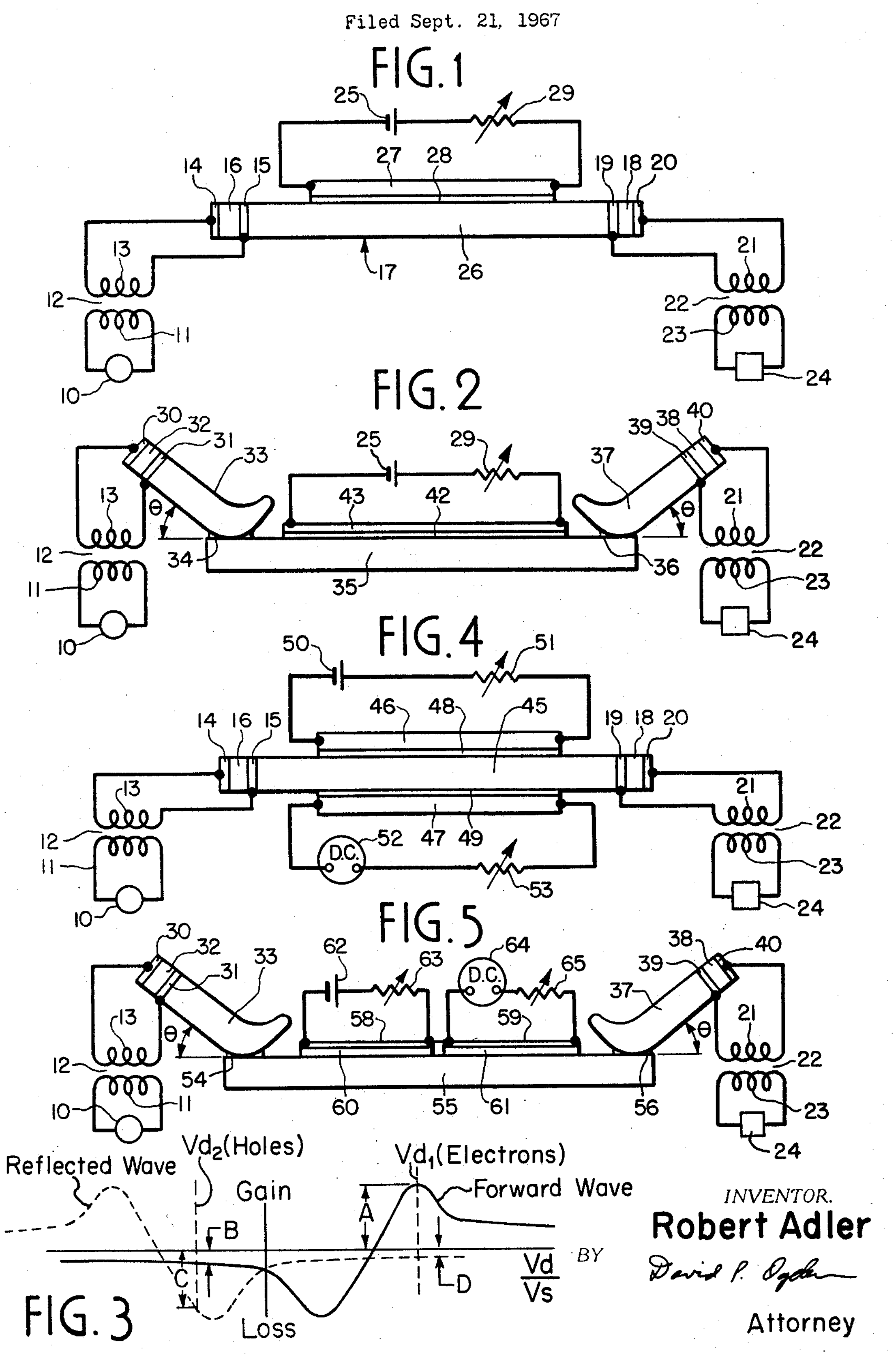
FIGURE 1 is a partly schematic side elevational view of one embodiment of a two-layer acoustic amplifying device.
FIGURE 2 is a partly schematic side elevational view of another embodiment of an acoustic amplifier which is particularly suited to the amplification of Rayleigh waves.
FIGURE 3 is a plot of gain versus the ratio of drift to sound velocities in a semiconductive medium.
FIGURE 4 is a partly schematic side elevational view of a further acoustic amplifier embodiment which is inherently unidirectional.
FIGURE 5 is a partly schematic side elevational view of yet another embodiment of a unidirectional amplifier which uses a Rayleigh wave transducer.

In FIGURE 1, a signal source 10 is coupled across the primary winding 11 of an input transformer 12 the secondary winding 13 of which is connected across the opposed surface electrodes 14 and 15 of a piezoelectric input transducer 16. Input transducer 16 is mechanically coupled to an input end of an acoustic wave propagating device 17 the output end of which, in turn, is mechanically coupled to a piezoelectric output transducer 18. The output electrodes 19 and 20 of output transducer 18 are coupled across the primary winding 21 of an output transformer 22 of the secondary winding 23 of which is coupled across a suitable output load impedance 24 which may, for example, be a detector of audio signals modulated on a carrier.

For the purpose of facilitating a better understanding of the present invention and, in particular, its differences from previous devices, the operation of a conventional device in a typical and simplest embodiment is herein first explained. Specifically, in a conventional solid-state acoustic amplifier, operationally similar to that described above in the introduction, a steady state biasing voltage source (not shown) is coupled between the ends of a simultaneously piezoelectric and semiconductive single element in the form of a bar elongated in the direction of wave propagation. The bar occupies the position of device 17 FIGURE 1. In operation, the input signal from source 10 induces mechanical vibration at a given frequency or range of frequencies of input transducer 16 which, in turn, transmits such vibration to the piezoelectric-semiconductive element. The resulting compressional- or longitudinal-mode mechanical wave vibrations are translated through the bar and are imparted to output transducer 18 wherein they are converted to an electrical output signal for application to load 24. Because of the presence of the steady state biasing voltage, the output signal developed across load 24 may be an amplified replica of the input signal applied from source 10. However, because of other noise vibrational tendencies of the device 17, amplification will occur at other frequencies than those applied to the input transformer 12. Since some of these other frequencies are not accepted by the output transformer 18, they will be reflected at an amplified magnitude toward the input end of the piezoelectric crystal element. If unattenuated, such signals will be again reflected and further amplified leading toward an unstable condition.

As actually illustrated in FIGURE 1, the piezoelectric-semiconductive-single element just described is replaced by a multiple-element wave propagating device. More particularly, device 17 is composed of two transversely juxtaposed elements 26 and 27 of lengths in the direction of acoustic wave propagation which are large relative to the wavelength in the piezoelectric element 26 of the acoustic wave to be translated.

Element 26 may be either a natural piezoelectric crystal or an element comprising a synthesized piezoelectric material such as polycrystalline barium titanate, lead zirconate or the like. Element 27 is a separate film or layer of silicon or other semiconductive material mechanically coupled to element 26; a typical material is 350 ohm-cm. N-type silicon which has a surface mobility of about 800 $cm.^2/V.$ sec. Since other semiconductors are generally responsive to light and/or heat, they may be conditioned to have a similar electron mobility. The two elements are cemented together by an electrically conductive bonding layer 28. Alternatively layer 28 may consist of a material which, while not conductive, exhibits high dielectric permittivity. As an example, silicone grease may be utilized. When the surface of element 26 is highly polished so as to maximize the capacitance between the joined materials, element 27 may be deposited directly onto element 26. In still another alternative, the surface layer only of the piezoelectric material is doped so as to be semiconductive.

The apparatus also includes a steady state bias voltage source, here schematically represented as a battery 25, which is coupled between the ends of semiconductive element 27. To permit adjustment of the gain of the translated acoustic wave, the apparatus further includes means for adjusting the bias voltage from source 25. In one of its simplest forms, as shown in FIGURE 1, this adjusting means is a variable resistor 29 connected in series with source 25. In single films where both electrons and holes are present, as in intrinsic lead sulfide, lead telluride, or tellurium, such a bias is adjustable to condition the electron charge carriers to move at an amplifying velocity.

Completing the mechanical assembly, an electrode layer, for example of chrome-gold, is evaporated onto one transverse face of each of the active transducers 16 and 18 which may be made of the same piezoelectric material as element 26. A conductive layer, in one example indium, is evaporated onto the opposed face of the transducer. A similar conductive layer is evaporated onto the input and output faces of element 26. The conductive layers are heated to a temperature just below their melting point after which the active transducers 16 and 18 are bonded to the respective ends of element 26 by pressing the heated conductive layers together and then allowing them to cool; the assembly forms layers 15 and 19 shown in FIGURE 1.

In operation, a signal from source 10 causes transducer 16 to experience mechanical strain which is impressed on piezoelectric element 26. In consequence, an acoustic wave of the compressional-mode type travels through element 26 and generates an alternating electric field travelling at the acoustic wave velocity. The field would typically be sinusoidal and would induce the formation of corresponding periodic bunches of electrical charge along the surfaces of element 26. The bunches of electrical charge that exist near the upper surface of piezoelectric element 26 cause a transverse electric field across bonding layer 28 and thereby induce charge bunches in semiconductive element 27 which correspond to the acoustic wave in element 26 and travel at the same acoustic wave velocity. At the same time, the D.C. voltage from source 25 applied across element 27 adds energy to the charge carrier movement in the semiconductor. At certain energy levels the surface charge bunches in the piezoelectric element 26 are augmented by these charge carriers. The augmented surface charge bunches in turn augment the transverse field which acts to increase the piezoelectric action of the acoustic wave in element 26.

When potential from source 25 is great enough so that the drift velocity of the carriers exceeds the velocity of the acoustic wave in element 26, the acoustic wave is amplified. At a specific steady state bias voltage, inducing a certain optimum drift velocity of the charge carriers in the direction of propagation of the acoustic wave, maximum amplification of the acoustic wave occurs. At other voltages, the acoustic wave achieves less gain or is attenuated. During amplification or attenuation of the desired acoustic waves, any noise in the system is similarly modified.

A careful analysis of the multi-layer device described above yields the conclusion that, unlike a single-element device, the multiple-material device operates by virtue of the so-called field effect. The electrical charge bunches, near the surface of the piezoelectric element, induce corresponding charge bunches in the semiconductor due to the transverse electric field created between the semiconductor and piezoelectric element. Changes in the conductivity of the semiconductor surface are then caused by the induced localized changes in the charge density, so that an alternating current component is generated. The applied unidirectional electric field adds energy to this current component. At certain energy levels, this current then modifies the distribution of surface charges and the fields generated by the modified charge pattern act back upon the piezoelectric element in such a manner as to enhance the amplitude of the acoustic wave in the piezoelectric medium.

Since amplification in the device of FIGURE 1 is due only to the charge bunches near a surface of the piezoelectric material, the remainder of the compressional-mode acoustic wave that is propagating along the piezoelectric element is not effective in the amplification process itself. For the most part, it simply increases the signal power necessary to propagate the acoustic wave in element 27. While the amount of power necessary is reduced by decreasing the width of piezoelectric element 27, a practical limit exists beyond which the resulting thin strip is mechanically too delicate and becomes difficult to support.

To achieve more efficient utilization of the acoustic wave, and thus surmount the aforementioned difficulty, it is preferred to make use of travelling surface acoustic waves. To this end, with reference to FIGURE 2, source 10 is coupled to the opposed surface electrodes 30 and 31 of a compressional acoustic wave transducer 32. Transducer 32 is, in turn, mechanically coupled to a surface wave launching medium 33 which in its turn is coupled by a bonding layer 34 to a longitudinal face portion at the input end of an acoustic wave propagating element 35. At the output end of element 35, mechanically coupled by a bonding layer 36 to the same longitudinal face as surface wave launching medium 33, is a surface wave receiving medium 37. Receiving medium 37 is, in turn, coupled to compressional-mode output transducer 38 the surface electrodes 39 and 40 of which are coupled to a load impedance 24. Steady state bias voltage source 25 with variable resistor 29 in series, is coupled across a semiconductor film 43 disposed on the same surface of element 35 which is acoustically coupled to mediums 33 and 37. Again the system is tuned so that certain ranges of frequencies are most easily accepted by the output transducer 38 and other frequencies are reflected as amplified noise.

Transducer 32 and its surface electrodes are basically similar to transducer 16 of FIGURE 1, and its surface electrodes may be fabricated and bonded to medium 33 in the same way that transducer 16 was joined to element 26. The particular surfaces on which the electrodes are evaporated or otherwise formed are chosen so as to produce mechanical strain in the direction of the electric field produced by the electrodes. Transducer 38 is likewise constructed and bonded to medium 37.

Launching medium 33 is aligned at an angle to bar-shaped element 35 such that a refracted surface shear wave enters into the element 35 parallel to its lateral surface. In other words, the angle of refraction, $r$ in medium 35 should be:

$$r=\frac{\pi}{2}$$

By Snell's law, the sine of the angle of incidence, $\theta$, must be equal to: $\sin \theta=V_{ic}/V_{rs}$ ($\sin r$), where $V_{ic}$ is the velocity of the incident compressional wave and $V_{rs}$ is the velocity of the refracted shear wave in element 35.

$$\text{Since } r=\frac{\pi}{2}$$

$\sin r=1$, and, therefore, $$\sin \theta=\frac{V_{ic}}{V_{rs}}$$

This means that the velocity of the compressional wave in medium 33 must be less than the velocity of a shear wave in element 35. A common choice for launching medium 33 is Lucite, an acrylic resin or plastic composed of polymerized methyl methacrylate, in which the compressional wave velocity is 2.65 kilometers per second.

The overall acoustic wave propagating device in FIGURE 2 is similar in construction to device 17 of FIGURE 1. More specifically, element 35 is of either a natural or a synthetic piezoelectric material and semiconductive film or layer 43 is juxtaposed and may be mechanically coupled to element 35 by a suitable bonding agent 42. The lengths in the direction of wave propagation of piezoelectric element 35 and film 43 are large relative to the wavelength in the piezoelectric element 35 of the surface acoustic wave to be translated, and element 35 is so extended beyond film 43 at the input and output ends as to accommodate mediums 33 and 37, respectively.

Surface-wave or Rayleigh-wave transducers, of the kind herein used for transducer 32 and its combined launching medium 33, are described more completely in the book Ultrasonic Delay Lines, by Brockelsby, Palfreeman and Gibson, (London, Iliffe Books Ltd. 1963).

Operationally, the signal from source 10 induces an electric field across transducer 32 which imparts a compressional wave to launching medium 33. Medium 33, in turn, induces a refracted surface wave in bar 35. A reflected wave also is developed. However, since it is in no way amplified, it is absorbed in the medium 33. The refracted wave in the element 35 becomes a Rayleigh or surface wave which interacts in the acoustic wave propagating device in the same manner as explained with respect to FIGURE 1. In other words, the Rayleigh wave transducer, in response to an input signal, impresses acoustic surface waves on the piezoelectric material which induce the development of charge bunches in film 43 corresponding to the acoustic wave on the piezoelectric material. Specifically, the amplitude of the acoustic wave is modified due to the interaction of the charge bunches on semiconductor 43 created by the electric field effect between elements 35 and 43 and the electric charge carrier flow established in the semiconductor film by the bias voltage across film 43. At the output, the other Rayleigh wave transducer responds to the surface acoustic wave and develops and output signal corresponding to the input signal. Specifically, the amplified wave is refracted into medium 37, the operation of which is the reverse of launching medium 33. A compressional wave is received by transducer 38 and converted to an electrical signal which is impressed across load 24.

The FIGURE 2 device may be as thick and thus as rugged as desired, since only a surface portion of element 35 actually carries acoustic energy. The surface waves, while travelling a little slower than shear waves, penetrate only a distance of about $\lambda/2\pi$ into the propagating medium, where $\lambda$ is the acoustic wavelength. High frequency acoustic waves, then, are effectively propagating entirely in a very thin strip on the surface of the much thicker piezoelectric crystal. Consequently, much less signal power is required than when using a compressional acoustic wave directly for the amplifying interaction.

The solid line curve of FIGURE 3 depicts the change in gain of forward directed acoustic waves propagating in an acoustic amplifying medium with variation in the ratio of the charge-carrier drift velocity, $Vd$, to the velocity of sound in the medium $Vs$. It will be observed that changing the drift velocity, by adjusting the bias voltage, makes it possible to produce either loss or gain. More particularly, it will be seen from FIGURE 3 that, for some value $Vd_1/Vs$, maximum gain A of a desired wave is achieved in a particular amplifying medium. The gain of inherently produced reflected acoustic waves as indicated by the dashed line curve, however, is under the influence of a negative bias voltage corresponding to a drift velocity of the same magnitude but of opposite relative direction.

From the plot, it is revealed that the reflected wave receives little attenuation D and, therefore, oscillation may be produced.

In order to make an amplifier truly unidirectional, the semiconductive properties are selected to provide two different classes of charge carriers. One class of carriers drifts at a velocity $Vd_1$ greater than that of the forward sound waves in the medium, producing forward gain. The second class of carriers simultaneously drifts in the opposite direction at a velocity $Vd_2$ which is lower than that of the reflected wave, producing backward loss. With respect to FIGURE 3, this is achieved by making the drift velocity $Vd_2$ of the carriers drifting in the back direction such that the value of $Vd/Vs$ for these carriers falls in an attenuation region and preferably near the indicated maximum attenuation region. At the same time, the drift velocity of the forward-moving carriers is such that the value of $Vd/Vs$ falls within the indicated maximum gain region.

Thus, in accordance with one aspect of the present invention, unidirectional amplification is accomplished by selecting semiconductor film 27 or 43 from a material having both classes of charge carriers present, that is electrons and holes. This requires that the semiconductor material be close to its intrinsic condition rather than being doped so as to become either an N-type or a P-type semiconductor. Also, the film material should be selected from one of those semiconductors having a relatively small band gap so as to provide substantial conductivity in the intrinsic condition. The material should also have a suitable ratio of electron and hole mobilities to amplify the forward wave and attenuate reflected waves. Suitable mobility ratios range from a minimum of less than two to one to a maximum of about ten to one. For the purpose of this discussion, a three to one speed ratio will be considered typical. This ratio is found in lead sulfide whose electron- and hole mobilities are 600 and 200, respectively. Other examples of suitable materials are lead telluride with mobilities of 6000 and 4000, and tellurium with mobilities of 2200 and 1000. All three of these materials have low band gaps of about 0.3 volt and lend themselves to being deposited in the form of thin films.

In FIGURE 3, amplification and attenuation of the forward wave and reflected wave is plotted as a function of the ratio of carrier drift velocity $Vd$ to sound velocity $Vs$. Positive values of $Vd/Vs$ denote carrier drift in the forward direction. The solid curve marked "forward wave" shows the gain or loss caused by drifting carriers which interact with a sound wave moving forward. The effect of drifting carriers upon a reflected wave which travels in the backward direction is given by the dashed curve marked "reflected wave."

Turning now to the specific conditions illustrated in FIGURE 3, a semiconductor film having a mobility ratio of 3:1 is subjected to a D.C. field of such intensity and direction that the electrons move forward at a drift velocity $Vd(E)=3Vs/2$ while the holes move backward at $Vd(H)=Vs/2$. The electrons produce a gain A in the forward wave; from this, however, the loss B produced by the holes must be subtracted, leaving a net gain or amplification of $A-B$. The reflected wave experiences a large loss C from the holes; to this the loss D caused by the electrons must be added, so that the total loss of the backward wave is $C+D$. Since $C+D$ is larger than $A-B$, attenuation of the reflected wave exceeds the gain of the forward wave and the amplifier is unconditionally stable.

FIGURE 3 is shown for the intrinsic condition in which the numbers of electrons and holes are equal. Controlled departures from this condition may be desirable. For instance, it will be noted that $C+D$ is much larger than $A-B$, providing a safety margin of stability which is larger than necessary. By a slight amount of N-type doping, the number of holes may be reduced to ½ the number of electrons. Forward gain then becomes $A-1/2B$, which is larger than before; backward loss goes down to $1/2C+D$, which may still be large enough to provide stability.

It is of course feasible to separate the forward and reverse charge carriers by having separate N-type and P-type film materials and using entirely separate films. The applied bias may then be independently optimized. Thus it is feasible to utilize film materials which do not have appropriate undoped charge carriers or an appropriate combination such as three to one, of mobilities. An embodiment of FIGURE 4 shows a two film amplification system.

As before, signal generator 10 in FIGURE 4 is coupled to transducer 16 which in turn is mechanically coupled to an acoustic amplifying element 45. The output end of element 45 is mechanically coupled to transducer 18 which in turn is coupled to load 24. As thus far described, the device in FIGURE 4 is, in structure, similar to the amplifier of FIGURE 1. However, in order for the acoustic amplifier to amplify unidirectionally, it includes piezoelectric element 45 together with a pair of semiconductor films 46 and 47 juxtaposed to element 45. The semiconductor films and the piezoelectric element are of lengths in the direction of acoustic wave propagation which are large relative to the wavelength in the piezoelectric material of the acoustic waves to be amplified.

Specifically, the opposed longitudinal surfaces of element 45 are mechanically coupled to semiconductive films or layers 46 and 47. The coupling is accomplished, as before, by the use of bonding layers 48 and 49. Individual bias sources are coupled across the semiconductive films. In particular, a first source here represented as battery 50 in series with a variable resistor 51 is coupled across semiconductive layer 46 and a similar direct current source 52 and variable resistor 53 are coupled across semiconductive film 47. In the case where the charge carriers of the film 47 are electrons and the carriers in the film 46 are electrons the D.C. source 52 are of a reversed polarity relative to that shown at 50. However if the carriers in the one film 47 are changed to holes, the D.C. sources 50 and 52 can be combined or at least can be of the same polarity.

While element 45 may be one of the synthetic piezoelectric materials, it is most reasonable in this case to use a natural material such as quartz, since the potential difference existing between the ends of the bar, particularly in the case of opposing potentials from battery 50 and source 52, may be so great as to cause a synthetic piezoelectric material to depolarize. Films 46 and 47 may be of the same material as utilized in the devices of FIGURES 1 and 2. When the majority charge carriers are the same in both films, the two bias sources are oppositely polarized relative to one end of element 45. Alternatively, with the two films individually being of opposite conductivity types, the bias sources are polarized alike relative to element 45. In any case, the relationship is such that the active charge carriers in the two films move in opposite directions.

In operation, signal source 10 impresses a signal across transducer 16 which responds thereto and impresses an acoustic wave on piezoelectric bar 45 along which the wave propagates and develops an electric field. At the output end of bar 45, transducer 18 develops an output signal which is fed to load 24. Once again, the operation of the device is, generally speaking, similar to that of FIGURE 1. However, the action afforded by the addition of the second semiconductive layer is such that the forward acoustic wave travelling from the input end to the output end of bar 45 is amplified, while the reflected wave travelling from the output end to the input end of bar 45 is attenuated.

More specifically, the effect of the mechanical strain induced by the compression-mode acoustic wave in piezoelectric bar 45 is to create accompanying electric fields which induce in films 46 and 47 the formation of eletcric charge bunches travelling at the acoustic wave velocity in the piezoelectric medium. These charges bunches, near the surfaces of bar 45 along which semiconductor films 46 and 47 are bonded, are free to interact across bonding layers 48 and 49 and induce changes in the surface charge density of the respective semiconductor films. The effect is to induce surface charge bunches on the semiconductor films, corresponding to the acoustic wave in the piezoelectric bar 45, which travel at the acoustic wave velocity and which are free to interact with electric charge carriers in the semiconductor films. The charge carriers travel parallel to the direction of wave propagation under the influence of bias source 50.

To achieve optimum operation, the voltage across semiconductor film 46 is adjusted to cause the carriers induced in film 46 to travel at a velocity exceeding the acoustic wave velocity of the forward wave. Consequently, the forward wave is amplified. At the same time, the voltage across semiconductive film 47 is adjusted to induce charge carriers flowing in the direction of the reflected acoustic wave to travel at a velocity that causes attenuation of that wave. That net result is unidirectional amplification, amplification of only the forward or desired wave.

In the device of FIGURE 4 amplification is accomplished only by way of the charge bunches that exist near those surfaces of piezoelectric bar 45 which are coupled to semiconductor films 46 and 47. In other words, the power necessary to propagate waves in bar 45 that does not go into the formation of surface charge bunches is not directly involved in the amplification process.

FIGURE 5 represents an embodiment of a unidirectional amplification in which the coupling between the propagated waves and the modifying films is increased over that in FIGURE 4. As in FIGURE 2, signal generator 10 is coupled to piezoelectric transducer 32 which, in turn, is mechanically coupled to surface wave launching medium 33. Launching medium 33 is mechanically oriented at angle $\theta$, which is determined as previously explained, and coupled by a conducting layer 54 to acoustic wave propagating element 55. The output end of element 55 is similarly coupled to surface wave receiving medium 37 which, in turn, is mechanically coupled through transducer 38 to load 24.

Thus, the device of FIGURE 5 utilizes Rayleigh wave transducers of the type depicted in FIGURE 2. The amplifying apparatus differs from the apparatus of FIGURE 2, however, in the construction of the semiconductive portion of the amplifier. As before, element 55 is constructed of a piezoelectric crystalline material. On its longitudinal surface to which surface wave transducers 33 and 35 are mechanically coupled, semiconductive films 58 and 59 are spaced end to end and coupled thereto mechanically, if desired, by bonding layers 60 and 61, respectively. Element 55 is, as before, long enough compared to a compressional wavelength to yield reasonable gain and is also of a length in the direction of wave propagation sufficient to support both of the semiconductive films and both of the Rayleigh-wave transducers. Semiconductor film 58 is biased by a battery 62 in series with a variable resistor 63 and semiconductive film 59 is biased by a similar arrangement of a direct current voltage source 64 and a variable resistor 65. Films 58 and 59 are biased relative to their respective conductivity types and the forward and reflected wave directions as in the case of the FIGURE 4 device.

In general, the signal translating device of FIGURE 5 operates quite similarly tot he device of FIGURE 2, and it takes advantage of the characteristics displayed in FIGURE 3 as used advantageously in the device of FIGURE 4. More particularly, a signal from source 10 is impressed across transducer 32 which transmits vibrations to launching medium 33. Medium 33 imparts to bar 55 a surface wave which propagates along the bar's length and is received at the output end by medium 37. The latter drives transducer 38 which produces a signal across load 24. Similarly to the device of FIGURE 2, the surface waves propagate along element 55 and induce electrical charge bunches which produce transverse electric fields. These fields create charge bunches travelling on the semiconductor films at the acoustic wave velocity. The interaction of these charges bunches with carriers induced by the bias means modifies the amplitude of the acoustic waves. In particular, as the forward acoustic wave propagates from the input end toward the output end of bar 55 in the region under film 58, the bias voltage on film 58 is polarized in a direction and has a magnitude selected to cause amplification of that acoustic wave. The latter acoustic wave then travels on out of the influence of film 58 and into the region of film 59 where it induces charge bunches in that film. The bias voltage on film 59 is adjusted to have a value with reference to FIGURE 3, such that the acoustic wave travelling in the forward direction receives little attenuation. At the same time, the value is such that the reflected wave receives maximum attenuation. Thus, this "cascaded" arrangement produces unidirectional amplification of surface waves, having the high efficiency obtainable with that mode of operation. Of course, either of films 58 or 59 may be biased to amplify the forward wave while the other is ibased to attenuate the reflected waves.

The principles herein disclosed are not restricted to amplifiers for producing a finite gain. That generic term has been used throughout for the purpose of description, and the principles, in whole or in part, are equally applicable for use in oscillators, mixers, modulators and the like. For instance, if it were desirable to use this device for a stable oscillator, a portion of the signal passing through the transformer 22 would be fed back to the transformer 12. In such a case it is a typical practice to have the input and output transducer systems tuned to a selected frequency. Furthermore, although some of the specific unidirectional amplifier embodiments herein described make use of two separate semiconductor films, and others describe a single film, a composite film can also be employed. By way of example, such a film may be created by first depositing one layer of a film which has primarily electron charge carriers and depositing a hole carrier semiconductor film portion over that electron carrier film portion. When applying two layers in this manner separated by an insulating layer as required, it is essential that the layers be thin enough so that both are well within the influence of the charge bunching phenomena created by the acoustic waves of the piezoelectric element.

It is evident that the present invention affords new and improved solid-state acoustic amplifiers which have substantial advantages over predecessor devices. Materially lower dissipation and substantially increased operating efficiency are achieved. The described acoustic amplifiers enable selection of piezoelectric and semiconductive properties separately, allowing for optimization of the amplifier characteristics and affording unidirectional operation.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:

1. A solid-state acoustic signal translating device subject to reflected acoustic wave considerations, comprising:

an acoustic wave propagating device including a piezoelectric element and juxtaposed semiconductive film means of lengths in the direction of acoustic wave propagation which are large relative to the wavelength in said element of the acoustic wave to be amplified, said film means being conditionable to have charge carriers flowing in opposite directions and at substantially different velocities;

first means coupled to said wave propagating device and responsive to an input signal for effecting propagation of forward directed acoustic waves along said element which induce corresponding waves in said film means;

second means coupled to said wave propagating device and responsive to the acoustic waves for developing an output signal;

and means for impressing steady state biasing voltage across said film means in such a way that charge carriers flowing in one direction amplify forward directed acoustic waves while charge carriers flowing in the opposite direction attenuate reflected acoustic waves with the attenuation of reflected waves being greater than the net amplification of the forward waves.

2. The acoustic signal translating device according to claim 1 wherein said first means develops Rayleigh waves in said element.

3. The acoustic signal translating device according to claim 1 wherein said film means comprises a pair of semiconductor films.

4. The acoustic signal translating device according to claim 1 wherein said film means comprises a semiconductor film having two different classes of charge carriers, one of the hole-type and one of the electron-type with the hole-type having a mobility substantially less than that of the electron-type.

5. The acoustic signal translating device of claim 1 wherein said second means is tuned to receive less than all of the acoustic wave frequencies which are subject to amplification by charge carriers flowing in said one direction.

6. A solid state acoustic amplifier comprising:

an acoustic wave progagating device including a piezoelectric element and an effective pair of semiconductor films juxtaposed to said element with said films and said element being of lengths in the direction of acoustic wave propagation which are large relative to the wavelength in said element of the acoustic waves to be amplified;

means coupled to said wave propagating device and responsive to an input signal for impressing acoustic waves on said element which induce corresponding charge bunches in said films;

means coupled to said wave propagating device and responsive to said acoustic waves for developing an output signal corresponding to said input signal;

and means for impressing respective bias voltages across said film parallel to said direction of wave propagation to establish a flow of electric charge carriers in each of said films to modify the amplitude of acoustic waves with the flows of said charge carriers in each of said films being in mutually opposite directions and at velocities respectively which are effective to amplify forward moving waves and attenuate reflected waves.

7. A solid state acoustic amplifier according to claim 6 wherein the pair of semiconductor films are respectively juxtaposed on different major longitudinal surfaces of the piezoelectric element.

8. A solid-state acoustic amplifier according to claim 6 wherein the pair of semiconductor films are juxtaposed in cascade fashion to the same major longitudinal face of the piezoelectric element.

9. An acoustic amplifier according to claim 6 wherein said films are biased in mutually opposite directions.

10. A solid-state acoustic amplifier comprising:

an acoustic wave propagating device including a piezoelectric element and an effective pair of semiconductor films juxtaposed to said element with said films and said element being of lengths in the direction of acoustic wave propagation which are large relative to the wavelength in said element of the acoustic waves to be amplified;

means coupled to said wave propagating device and responsive to an input signal for impressing acoustic waves on said element which induce corresponding charge bunches in said films;

means coupled to said wave propagating device and responsive to said acoustic waves for developing an output signal corresponding to said input signal;

and means for impressing a biasing voltage across each film in such a way that the charge carriers in one of said films produce amplification of forward acoustic waves and carriers in the other of said films produce attenuation of reflected acoustic waves.

11. An amplifier as defined in claim 10 in which said acoustic waves impressed on said piezoelectric element are Rayleigh waves.

12. A solid-state acoustic signal translating device, comprising:

an acoustic wave propagating device including a piezoelectric element and a juxtaposed semiconductor film of lengths in the direction of acoustic wave propagation which are large relative to the wavelength in said element of the propagated acoustic wave, said film having two different classes of charge carriers, one of the hole-type and the other of the electron-type, said types having substantially different mobilities;

means coupled to said wave propagating device and responsive to an input signal for effecting propagation of acoustic waves along said element which induce development of corresponding charge bunches in said film;

means coupled to said wave propagating device and responsive to said acoustic waves for developing an output signal;

and means for impressing a biasing voltage across said film in such a way that carriers of one of said classes amplify forward acoustic waves while carriers of the other of said classes attenuate reflected acoustic waves.

No references cited.

ROY LAKE, *Primary Examiner.*

D. R. HOSTETTER, *Assistant Examiner.*